United States Patent [19]

Edwards, III

[11] Patent Number: 5,269,137
[45] Date of Patent: Dec. 14, 1993

[54] GAS TURBINE ELEMENTS BEARING COKE INHIBITING COATINGS OF ALUMINA

[75] Inventor: William H. Edwards, III, Port St. Lucie, Fla.

[73] Assignee: United Technologies Corporation, Hartford, Conn.

[21] Appl. No.: 811,356

[22] Filed: Dec. 20, 1991

[51] Int. Cl.⁵ .............................................. F02K 3/10
[52] U.S. Cl. .................................... 60/261; 60/752
[58] Field of Search ..................... 60/261, 752, 737

[56] References Cited

U.S. PATENT DOCUMENTS

| | | | |
|---|---|---|---|
| 3,678,306 | 7/1972 | Garnier et al. | 60/261 |
| 3,779,006 | 12/1973 | Lewis et al. | 60/39.31 |
| 4,297,150 | 10/1981 | Foster et al. | 148/6.3 |
| 4,297,246 | 10/1981 | Cairns et al. | 252/465 |
| 4,942,732 | 7/1990 | Priceman | 60/261 |
| 5,013,499 | 5/1991 | Willard | 264/30 |

*Primary Examiner*—Richard A. Bertsch
*Assistant Examiner*—Michael I. Kocharov
*Attorney, Agent, or Firm*—Herbert W. Mylius

[57] ABSTRACT

Fuel contacting elements for gas turbines comprise high temperature alloys having a coke inhibiting layer of alumina thereupon.

7 Claims, No Drawings

GAS TURBINE ELEMENTS BEARING COKE INHIBITING COATINGS OF ALUMINA

The invention was made under a U.S. Government contract and the Government has rights herein.

BACKGROUND OF THE INVENTION

1. Field of the Invention

This invention relates to materials for use in preventing the deposition of carbon, or coke, on fuel wetted surfaces located in high temperature zones of gas turbine engines. Coke deposition is an undesirable side effect caused by the catalytic-thermal degradation of hydrocarbon fuels during their consumption in gas turbine engines. Such deposition leads to performance loss, reduced heat transfer efficiencies, increased pressure drops, costly decoking procedures, and increased rates of material corrosion and erosion. The metals most prone to catalyze coke deposition are those metals commonly found in the alloys utilized in components exposed to high temperature, fuel wetted environments of gas turbine engines, typically found in jet engines in the combustor and afterburner fuel delivery systems.

2. Description of the Prior Art

Carburization, or the formation of coke deposits, has been noted particularly in high temperature environments where carbon containing fluids come in contact with metals or metal alloys. Exemplary of such environments are high temperature reactors, such as refinery crackers, thermal crackers, distillation units for petroleum feedstock, and gas turbine components. Conventional methods used to reduce coke formation and carburization in steam cracking operations involve the steam pre-treatment of the surface to promote formation of a protective oxide skin. The surface may then be further protected by the deposition of a high temperature, stable, non-volatile metal oxide on the pre-oxidized substrate surface by thermal decomposition from the vapor phase of a volatile compound of the metal.

While the chemical vapor deposition of an alkoxysilane has been demonstrated to reduce the rate of coke formation in the pyrolysis section of an ethylene steam cracker by formation of an amorphous silica film on the internal surfaces of high alloy steel tubing at 700° to 800° C., no one to date has solved the problem of coke deposition on fuel contacting hardware in gas turbine engines.

Alumina coatings have been applied to a large number of substrates for various purposes, but never, to our knowledge, for the prevention of coke deposition on fuel contacting elements in gas turbines. For example, flame sprayed coatings of alumina have been applied to foundry molds, but lacked adherence due to thermal shock. In U.S. Pat. No. 2,903,375, Peras attempted to overcome this problem by applying layered coatings of cermets containing alumina and chromium. Montgomery et al, in U.S. Pat. No. 2,775,531, suggest the application of aluminum-alumina cermets to metal substrates by flame spraying and sintering to provide high temperature oxidation resistance and thermal insulation. In U.S. Pat. No. 3,839,618, Muehlberger teaches spray coating stainless steel with a dielectric layer of alumina. Hecht, in U.S. Pat. No. 4,034,142, teaches the protection of nickel and cobalt superalloy articles at elevated temperatures by the formation of a coating having an external continuous layer composed predominately of alumina, which reduces oxidation and corrosion.

SUMMARY OF THE INVENTION

The present invention relates to a means for reducing coke formation on fuel contacting components of gas turbines, such as in the combustor and afterburner of a jet engine. A thermally resistant barrier is applied to prevent contact of the fuel with catalytic agents such as iron, nickel, and chromium, contained in the base metals from which fuel contacting components are fashioned. Specifically, the fuel contacting components are coated with a thin, high temperature resistant layer of alumina, which reduces the rate and severity of coke deposition on the surfaces.

DESCRIPTION OF THE PREFERRED EMBODIMENTS

Coke deposition has been found to be an undesirable side effect caused by the thermally accelerated degradation of hydrocarbon fuels during their use for power generation in gas turbine engines. It is a particular goal of the present invention to produce fuel contacting components for gas turbine engines such as fuel nozzles, fuel lines, and augmentor spray manifolds, and such other components as lubrication systems and breather tubes, having reduced tendencies to form coke.

It is known that hydrocarbon fuels may degrade either under high temperature conditions, i.e. thermally, or under lower temperature conditions in the presence of a catalytic material. One approach to the problem in the past has been to regulate the quality of the fuel consumed, so as to limit degradation thereof. However, as engines are required to run faster and hotter to achieve greater output, the ability of present day hydrocarbon fuels to provide the required performance without coking is lessened.

Further, since many of the metals required for the construction of higher temperature gas turbine engines are catalytic to the degradation of hydrocarbon fuels, coke formation has become of greater concern. Accordingly, materials have been sought which would increase the temperature at which engines may operate without degradation of the fuel and deposition of coke. It has now been found that provision of a suitable coating on fuel contacting surfaces, which acts as a barrier between the hydrocarbon and the catalytic elements in the surfaces, will greatly reduce coke formation. Certain high temperature resistant materials either do not participate in the mechanism of catalytic-thermal deposition of coke, or participate to a much lesser degree than such metals as iron, nickel, chromium, or their alloys. It has also been noted in the course of our investigations that certain materials actually enhance the degradation of carbon containing fuels. These same materials, when exposed to elevated temperatures, cause any gums and/or varnishes which do form to completely burn away. A suitable coating has been found to comprise a thin layer of $Al_2O_3$, which may be applied by a number of methods. For example, the alumina may be applied by such conventional coating techniques as sputtering, deposition from a sol, plasma spray, electric arc, and flame spray, etc. Care must be taken in the coating to assure a complete coverage of the substrate, a uniform thickness of alumina, and purity of the coating as applied. Appropriate cleaning steps, pre-treatments, and post-treatments as are known in the art may be utilized to achieve a uniform, dense, and impervious coating. Choice of the coating technique may be dependent upon such factors as the composition of the substrate, and the difficulty of application to all fuel contacting surfaces of the element being protected. The alumina coating may have a thickness of from about 0.00005 inches to about 0.001 inches, preferably from about 0.0001 inches to about 0.0005 inches. Such a coating is stable in hydrocarbon fuels, and is thermally stable at temperatures from about minus 200° F. to about 2000° F. The coating may have a homogeneous composition and density, or have a controlled composition with a density gradient from the outermost surface to the portion in contact with the turbine element. Sub-coats or bond coats may be present if necessary to achieve an adherent bonding to the substrate.

A number of primary factors were identified which relate to the deposition of hydrocarbons in gas turbines. These include fuel composition, temperature, time, the availability of oxygen, and the presence of catalytic materials in the surface of the fuel handling components. For an operating gas turbine, each of these factors has an almost infinite number of possible values, with the exception of the composition of the fuel contacting elements of the gas turbine engine itself. Accordingly, the present invention is directed to control of the surface composition of the fuel handling components of the gas turbine engine, and specifically to the provision of surface coatings of alumina coatings thereupon to reduce the deposition of carbon, or coking.

Alloys used in hydrocarbon fuel burning engines commonly contain metals which catalyze coke deposition, such as iron, nickel, and chromium. Thermal degradation occurs as a matter of course, and there are periods during the operation of turbine engines when fuel flow is very low, or as in the case of military engine augmentor plumbing, i.e. fuel feed tubes and spray manifolds, there is no fuel flow at all. During such periods, the temperature of the residual fuel left in the plumbing can rise, causing the fuel to boil and increase coke deposition from accelerated fuel degradation reactions and thermal cracking. The contributions of various metallic hardware surfaces to coke deposition were evaluated with a goal of determining the best method for reducing the formation and adherence of coke. It has been learned that coking may be reduced by the presence of a surface layer of an anti-coking material on the surfaces of the fuel handling components of a gas turbine engine. Such anti-coking material may be of a nature to either reduce or inhibit the tendency of coke to adhere to the surface, or, conversely, to enhance the catalysis of the surface and increase the reactivity such that any gums and varnishes which tend to form are caused to react further, breaking them down to gaseous products which are eliminated.

It is also to be noted that the presence of certain particulate metallic oxide materials, such as silica, ceria, cupric oxide, in the coke inhibiting layer, may add to the surface catalysis. Such particulates should range in size from about 45 microns to about 150 microns, and preferably from about 45 microns to about 75 microns in diameter, and should comprise from about 10 percent to about 45 percent of the volume of the coating layer.

Surfaces which may be coated for prevention of coking include fuel lines, fuel nozzles, augmentor spray manifolds, and other hydrocarbon contacting surfaces of gas turbines, such as lubrication systems and breather tubes. Such surfaces may comprise such materials as titanium and titanium alloys, aluminum, stainless steels, and nickel base alloys such as Inconel and Waspaloy. In addition, the present invention may be suitable for prevention of coking on other surfaces, such as copper, zirconium, tantalum, chromium, cobalt, and iron, for example. While the examples which follow relate to components fashioned of Waspaloy or Inconel alloys, it is to be understood that the present invention is not to be limited thereto.

To evaluate the effectiveness of experimental coatings in reducing the tendency of jet fuel to form coke deposits on a metal substrate, Waspaloy samples were utilized under conditions simulating the operational conditions to be anticipated in a high performance military aircraft engine. In a typical military flight scenario, fuel is heated as it travels through the fuel plumbing on its way to the combustor and/or augmentor of the engine to be burned. Generally, the fuel flow rate is sufficiently high to limit the effect of those factors which relate to coking. However, during flight, when the augmentor is shut off, spray manifold temperatures in the afterburner section rise considerably, going from about 350° F. to about 1000° F. or higher in some areas. Fuel left in the spray manifold in these areas boils, and with no place to flow, degrades rapidly to form insoluble, sticky, gum-like varnishes, which after a number of cycles results in formation of coke deposits. A similar scenario occurs in the engine combustor fuel nozzles at engine shutdown. However, since the augmentor is cycled on and off much more frequently than the engine is, it is to be expected that the augmentor fuel plumbing would have a higher coking rate than the combustor fuel nozzles. Accordingly, the conditions encountered at the spray manifold of the augmentor section were selected as representative of conditions which result in coke deposition.

EXAMPLE 1

Coatings of silica, alumina, and tungsten disulfide were initially evaluated for effectiveness against carbon deposition in the liquid phase, i.e. in flowing fuel with no boiling. Silica coatings were applied by dipping in a solution containing 41.3% tetramethylorthosilicate (TMOS), 38.9% methanol, and 19.8% distilled water. The specimen surface was first pre-oxidized at 1000° F. The dip was followed by air drying, and repeated four times, followed by firing at 1000° F. Sol gel alumina coatings were applied in a manner similar to the TMOS silica, but in two sets of four dips each with firings at 1112° F. in vacuum ($10^{-5}$ torr) for 5 hours between dip sets. The tungsten disulfide coatings were applied through an air blast gun at 120 psi, with the gun positioned 10 to 12 inches from the surface. The reductions in coke deposition achieved are set forth in Table I. These are averages of duplicate results as compared to uncoated specimens, subjected to identical conditions.

TABLE I

| DEPOSIT REDUCTION | |
| --- | --- |
| Coating Type | Reduction |
| None | — |
| Silica | 28% |
| Alumina | 18% |
| Tungsten disulfide | 5% |

EXAMPLE 2

A second test was conducted using the coked test specimens from the first experiment. In this experiment the ability of each coating to rapidly catalyze the gasification of the deposited coke was evaluated. The coked specimens from Example 1, along with the uncoated blank specimens, were placed in a furnace at 1050° F. for two hours. The oxygen content of the atmosphere in the furnace was lowered with nitrogen to simulate the reduced oxygen environment inside a spray manifold. The results are set forth in Table II. The uncoated specimens showed no observable reduction in coke deposits. The tungsten disulfide coating, however, suffered some coating loss, apparently due to exceeding its upper temperature capability in air. No coating loss was noted for the other coatings.

TABLE II

| Coating Type | DEPOSIT LOSS Reduction |
| --- | --- |
| None | — |
| Silica | 100% |
| Alumina | 90% |
| Tungsten disulfide | 100% |

EXAMPLE 3

Considering these results, the same coatings were tested to determine their ability to promote the gasification of coke deposits under conditions similar to those thought to exist in an operating engine between augmentation cycles, i.e. after shutdown of the afterburners. If such were the case, and the specific coating did not permit a greater coke deposition rate than did the Waspaloy, then the initial deposits which did form might be removed during higher temperature periods when the augmentor was shut down. If the removal rate were great enough, then deposits would be removed almost as they formed.

To do this, a furnace was set up with a nitrogen purge to reduce the air content to approximate that existing in the spray ring area after augmentor cancellation. Blank and coated Waspaloy Jet Fuel Thermal Oxidation Tester tubes which had been previously coked were placed in the furnace and heated to 1050° F. for two hours. Weight changes were recorded, but apparently substrate oxidation weight gains offset some weight loss from coke gasification, as apparent from examination of the tubes under magnification. The uncoated (blank) tubes had lost some, but very little, deposit. The coated tubes ranked as set forth in Table III with respect to the reduction of coke deposit.

TABLE III

| Coating type | DEPOSIT LOSS Reduction |
| --- | --- |
| Tungsten Disulfide | 30% |
| Sol gel alumina | 90% |
| TMOS silica | 100% |

These results are indicative that even if small coke deposits occur during augmentation cycling, those deposits may be gasified during the "off" cycle of the augmentor, if the augmentor surface is protected by a coating of alumina, applied from a sol gel.

It is to be understood that the above description of the present invention is subject to considerable modification, change, and adaptation by those skilled in the art to which it pertains, and that such modifications, changes, and adaptations are to be considered within the scope of the present invention, which is set forth by the appended claims.

What is claimed is:

1. A liquid fuel contacting element of a gas turbine engine, said element consisting of a material selected from the group consisting of titanium, titanium alloys, aluminum, stainless steel, and nickel base superalloys, said material being coated with a carbon gasification enhancing layer of alumina from 0.00005 inches to 0.001 inches in thickness, wherein said layer of alumina further comprises metallic oxide particles selected from the group consisting of silica, ceria, and cupric oxide.

2. The element of claim 1, wherein said layer of alumina is from 0.0001 inches to 0.0005 inches in thickness.

3. The element of claim 2, wherein said particles are about 45 microns to 150 microns in size, and comprise about 10 percent to 45 percent of the volume of said layer.

4. The element of claim 3, wherein said material comprises a nickel superalloy.

5. An augmentor spray manifold for a jet engine, said manifold consisting of a metal alloy selected from the group consisting of titanium, titanium alloys, aluminum, stainless steel, and nickel base superalloys, said metal alloy having a carbon gasification enhancing layer of alumina from 0.00005 inches to 0.001 inches in thickness on the fuel contacting surfaces, wherein said layer of alumina further comprises metallic oxide particles selected from the group consisting of silica, ceria, and cupric oxide.

6. The manifold of claim 5, wherein said particles are about 45 microns to 150 microns in size, and comprise about 10 percent to 45 percent of the volume of said layer.

7. The manifold of claim 6, wherein said metal alloy comprises a nickel superalloy.

* * * * *